United States Patent
Moon

(10) Patent No.: US 7,248,198 B2
(45) Date of Patent: Jul. 24, 2007

(54) REFERENCE VOLTAGE DRIVING CIRCUIT AND PIPELINED ANALOG TO DIGITAL CONVERTER INCLUDING SAME

(75) Inventor: Jung Woong Moon, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/357,756

(22) Filed: Feb. 17, 2006

(65) Prior Publication Data

US 2006/0187108 A1    Aug. 24, 2006

(30) Foreign Application Priority Data

Feb. 21, 2005  (KR) .................. 10-2005-0014260

(51) Int. Cl.
*H03M 1/34* (2006.01)
(52) U.S. Cl. ..................... 341/162; 341/158
(58) Field of Classification Search ......... 341/150–170
See application file for complete search history.

(56) References Cited

U.S. PATENT DOCUMENTS 4,216,393 A * 8/1980 Gillberg et al. ............. 326/88
4,709,168 A * 11/1987 Kamuro et al. ............. 326/120
6,873,143 B2 * 3/2005 Moon et al. ................ 323/312

\* cited by examiner

*Primary Examiner*—Lam T. Mai
(74) *Attorney, Agent, or Firm*—Lee, Hong, Degerman, Kang & Schmadeka

(57) ABSTRACT

A reference voltage driving circuit and a pipelined analog to digital converter including the reference voltage driving circuit capable of providing a stable reference voltage even during a high speed/high resolution of analog-to-digital conversion using source follower circuits. Furthermore, a MDAC (Multiplying Digital to Analog Converter) requiring a high precision and a flash ADC (Analog to Digital Converter) requiring a relatively low precision are driven by respectively separate reference voltage driving circuits to thereby enable to curb an introduction of noise from the flash ADC into the MDAC requiring a high precision. Accordingly, there is no need of using a large capacity of capacitor for stabilizing the reference voltage, thereby enabling an embodiment with a smaller area and reducing the power consumption.

7 Claims, 5 Drawing Sheets

US 7,248,198 B2

REFERENCE VOLTAGE DRIVING CIRCUIT AND PIPELINED ANALOG TO DIGITAL CONVERTER INCLUDING SAME

This application claims priority to an application filed in the Korean Industrial Property Office on Feb. 21, 2005, and assigned serial No. 10-2005-0014260 (SIC04-106), the contents of which are incorporated herein by reference.

BACKGROUND OF THE INVENTION

1. Field of the Invention

The present invention relates to a reference voltage driving circuit. More particularly, the present invention relates to a reference voltage driving circuit and a pipelined analog to digital converter including the reference voltage driving circuit configured to allow a reference voltage supplied to MDAC (Multiplying Digital to Analog Converter) and a flash ADC (Analog to Digital Converter) of pipelined ADC to hold a constant value so that a high speed analog to digital conversion can be stably implemented without using a large capacity on-chip capacitor.

2. Description of the Related Art

Recently, high speed/high resolution ADCs are widely employed in a variety of electronic systems including computer modems, next generation wireless telephones, satellite receivers, process control systems, high speed digital communication networks and medical equipment thanks to development of Complementary Metal Oxide Semiconductor (CMOS) process and digital signal process technologies. Particularly, application systems such as Thin Film Transistor-Liquid Crystal Displays (TFT-LCDs) and CDMA (Code Division Multiple Access) system wireless communication standard IMT-2000, and xDSL (x Digital Subscriber Line) require sampling speed of over 100 MHz and resolutions of over 8 bits, thereby necessitating use of high speed/high resolution ADCs.

The ADCs used for these types of high performance systems require minimum external pins, small areas and low power consumptions.

FIG. 1 is a block diagram illustrating a construction of a pipelined ADC employed for high speed/high resolution analog-to-digital conversion.

Referring to FIG. 1, the ADC structured of plural stages includes a sample/holder amplifier (11-1) for receiving an analog input signal from a preceding stage thereof and sampling/holding the signal, a flash ADC (12-1 to 12-n) for converting the analog signal sampled by the sample/holder amplifier (11-1) to a digital output signal, and an MDAC (Multiplying DAC) for converting the digital signal outputted from the flash ADC (12-1 to 12-n) again to an analog signal, summing up the analog signal with an analog signal of the preceding stage having passed the sample/holder amplifier (11-1) and outputting the summed signal.

A DCL (Digital Correction Logic.14) processes a digital signal converted at each stage of the flash ADC (12-1 to 12-n) and outputs a final digital signal.

Meanwhile, a reference voltage driving circuit 10 of the ADC as illustrated in FIG. 1 supplies two reference voltages for converting an analog signal to a digital signal. The ADC divides a gap between the two reference voltages into predetermined numbers of levels, compares the inputted analog signal with the divided levels and digitalizes by mapping to the divided level.

The two reference voltages REFT and REFC are processed by the reference voltage driving circuit 10 and are supplied to each MDAC (11-2 to 11-n) and each flash ADC (12-1 to 12-n).

The reference voltage driving circuit 10 is operated in such a manner that an inner transistor switches between turn-on and turn-off according to a clock signal, and instant charge and discharge of channel charges are repeated. Because of this operation, an output node voltage of the reference voltage driving circuit 10 is hard to hold a constant value. Consequently, as long as the reference voltage is not held at a constant level, it is difficult to expect an operational speed and a resolution required by a high speed/high resolution ADC.

In order to cope with the aforementioned problem, the existing reference voltage driving circuit is so constituted as to bypass a noise component generated from high frequency by connecting capacities of several F at an external side of chips of an integrated circuit. However, this kind of method cannot be applied for use on SoC (System on Chip) where too many limitations are involved with pins.

FIG. 2 is an exemplary circuit diagram illustrating the conventional reference voltage driving circuit for restraining the use of external pins. The reference voltage driving circuit 10 in FIG. 2 includes amplifiers 21 and 22 each having a unity gain. Output terminals of the amplifiers 21 and 22 are connected to large capacity capacitors 23 and 24 and integrated in order to remove noise components created by the high frequency. In this case, each of the large capacity capacitors has a very large size. After all, area of the ADC is enlarged in order not to use external pins if the large capacity of capacitors is employed thereinside.

Particularly, this kind of inner capacitors require a further enlarged capacitance as an operational speed of the ADC increases. Consequently, in case of an ADC having an operational speed of over 100 MHz, an area of the inner capacitor further increases to pose as a considerably cumbersome burden.

SUMMARY OF THE INVENTION

The object of the present invention is to provide a reference voltage driving circuit capable of stably supplying a reference voltage of an integrated circuit operating under high speed/high resolution without using an external pin or an inner large capacity on-chip capacitor.

Another object is to provide a reference voltage driving circuit for a pipelined ADC capable of stably supplying a reference voltage of an integrated circuit operating under high speed/high resolution without using an external pin or an inner large capacity on-chip capacitor.

In accordance with the object of the present invention, there is provided a reference voltage driving circuit for a pipelined ADC comprising: a first source follower for receiving a predetermined first reference voltage (REFT) to output a first output voltage (RTOP_MDAC) corresponding to the first reference voltage to a MDAC (Multiplying Digital to Analog Converter); and a second source follower for receiving a second reference voltage (REFC) having a predetermined voltage difference from the first reference voltage, and outputting to the MDAC a second output voltage (RBOT_MDAC) corresponding to the second reference voltage and having the voltage difference.

The first source follower may include a first transistor whose source is connected to a predetermined source voltage, and receiving a predetermined bias signal via its gate; and a second transistor (MPT1) whose source is connected to a drain of the first transistor and whose drain is connected to ground and receiving the first reference voltage via its gate.

The first source follower includes a third transistor (MPC2) whose source is connected to a predetermined source voltage and receiving a predetermined bias signal via its gate; and a fourth transistor (MPC1) whose source is connected to a drain of the third transistor and whose drain is connected to ground and receiving the second reference voltage via its gate, wherein the predetermined bias signals received by the first transistor and the third transistor are identical.

The first and second source followers may be embodied by MOSs (Metal-Oxide Semiconductors).

The first source follower includes a transistor (MPT1) for receiving a predetermined constant current ($I_d$) via its source and whose drain is connected to ground and for receiving the first reference voltage via its gate, and the second source follower includes a transistor (MPC1) for receiving a predetermined constant current ($I_d$) via its source and whose drain is connected to ground and for receiving the second reference voltage via its gate, wherein the first and second source followers are identically constructed in sizes (W/L) of transistors thereof, and a difference between the first output voltage and the second output voltage is the same as that between the first reference voltage and the second reference voltage.

The reference voltage driving circuit according to the present invention may further include a first amplifier for receiving the first output voltage (RTOP_MDAC) to output to a flash ADC an output signal (RTOP_FL) amplified in unity gain, and a second amplifier for receiving the second output voltage (RBOT_MDAC) to output to the flash ADC an output signal (RBOT_FL) amplified in unity gain, wherein the first source follower, the second source follower, the first amplifier and the second amplifier may be packaged into one chip by a semiconductor fabricating process along with the pipelined ADC.

A pipelined ADC according to another aspect of the present invention includes a first source follower, a second source follower, an amplifier part, a first converting part, a second converting part and a DCL (Digital Correction Logic), wherein the first source follower receives a predetermined first reference voltage (REFT) to output a first output voltage (RTOP_MDAC) corresponding to the first reference voltage, and the second source follower receives a second reference voltage different from the first reference voltage to output a second output voltage (RBOT_MDAC) corresponding to the second reference voltage.

The amplifier part receives the first output voltage and the second output voltage to output output signals (RTOP_FL) (RBOT_FL) amplified in unity gains.

The first converting part converts to a first digital signal a first analog signal sampled and held by receiving a predetermined analog signal, and the second converting part receives the signal held by the first converting part and a first digital signal, and outputs an i th digital signal for every i th circuit block including a plurality (n) of circuit blocks (2 i n).

The DCL processes the first to n th digital signals outputted from the first converting part and the second converting part and outputs a final digital signal.

The i circuit block of the second converting part includes an MDAC for converting an i–1 digital signal outputted from the i–1 stage to a reference voltage, based on the first and second output voltages as reference voltages, and for outputting the i th analog signal summed with the i–1 analog signal outputted from the i–1 stage, and a flash ADC for converting the i analog signal to the i th digital signal and outputting it, based on the output signals (RTOP_FL) and (RBOT_FL) amplified by the amplifier.

BRIEF DESCRIPTION OF THE DRAWINGS

The invention will be more fully understood from the detailed description of illustrative implementations presented below, which should be read in conjunction with the accompanying drawings.

DESCRIPTION OF THE PREFERRED EMBODIMENTS

Next, preferred embodiments of the present invention will be described in detail below by referring to the attached drawings.

Figure 3:
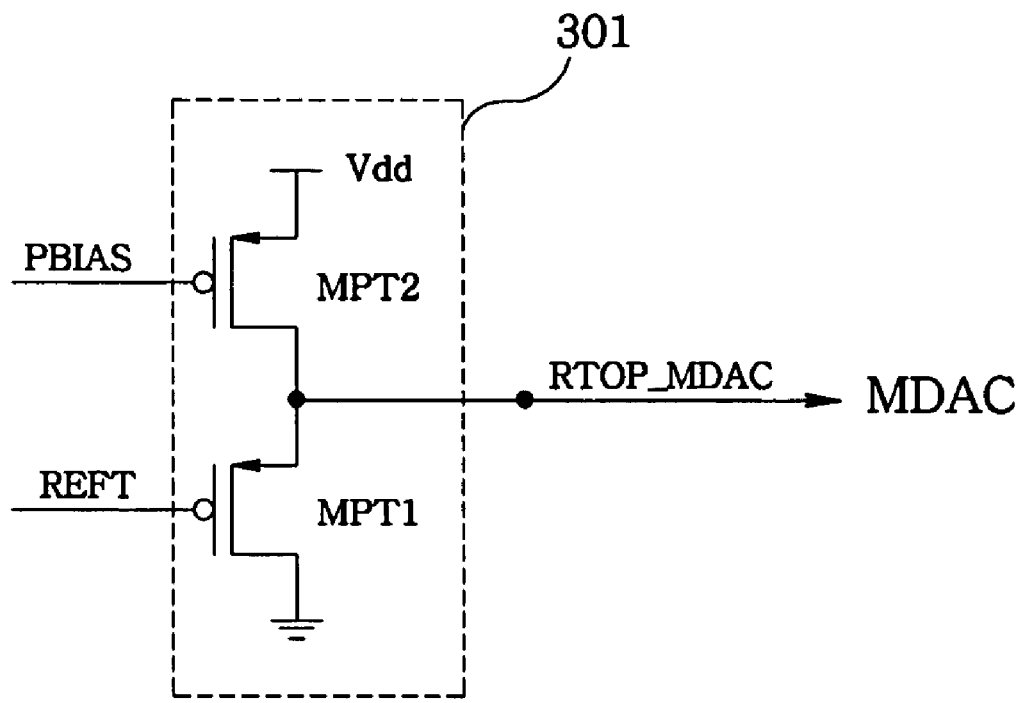
FIG. 3 illustrates a reference voltage driving circuit according to one embodiment of the present invention.
Figure 3:
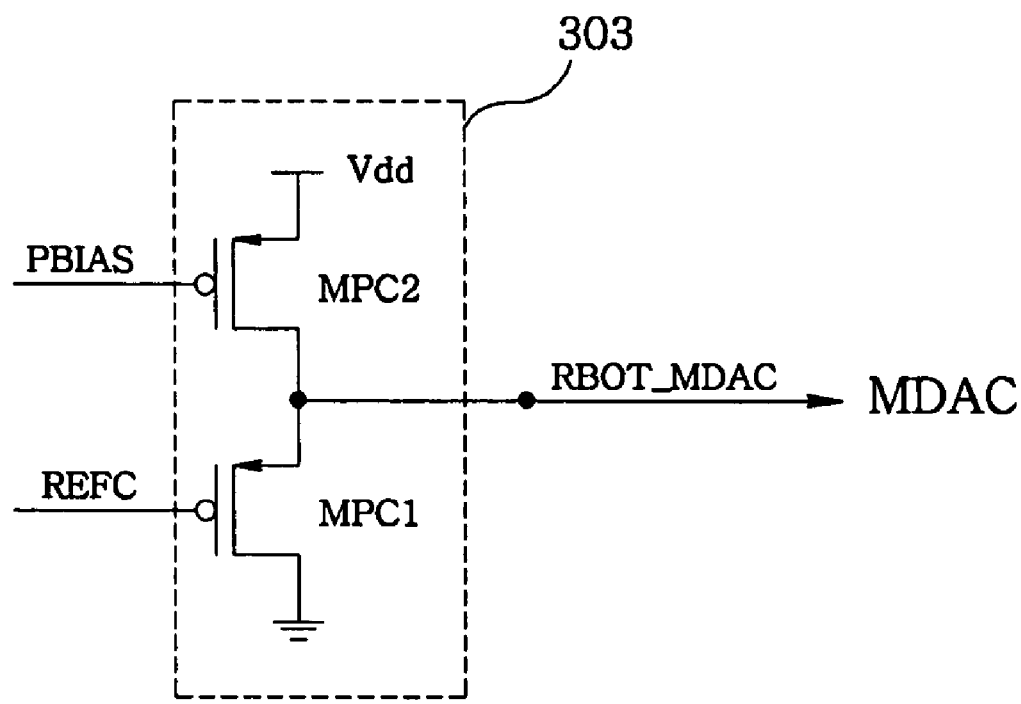

FIG. 3 illustrates a reference voltage driving circuit according to one embodiment of the present invention, where the reference voltage driving circuit 300 supplies a constant reference voltage to an analog integrated circuit or a digital integrated circuit operating at a high speed.

Figure 1:
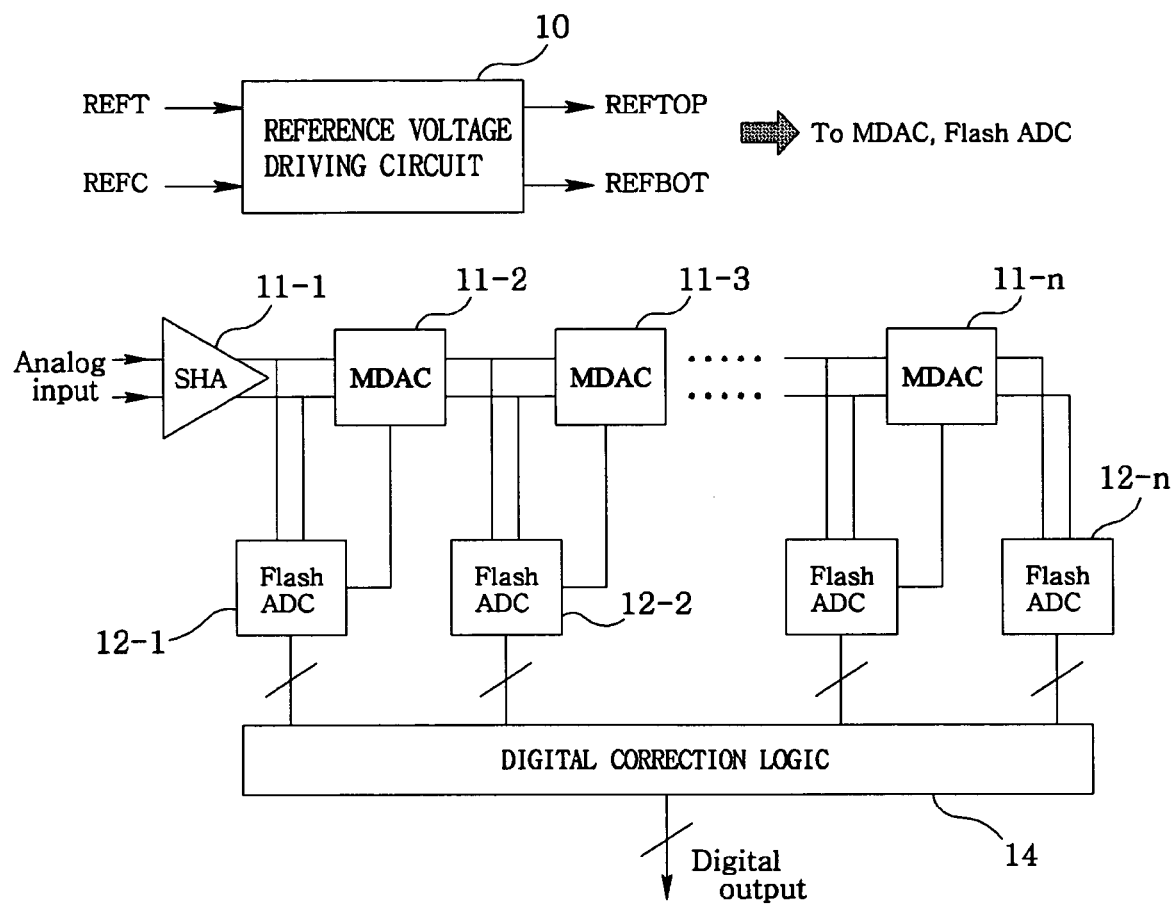
FIG. 1 illustrates a structure of a pipelined ADC.
Figure 2:
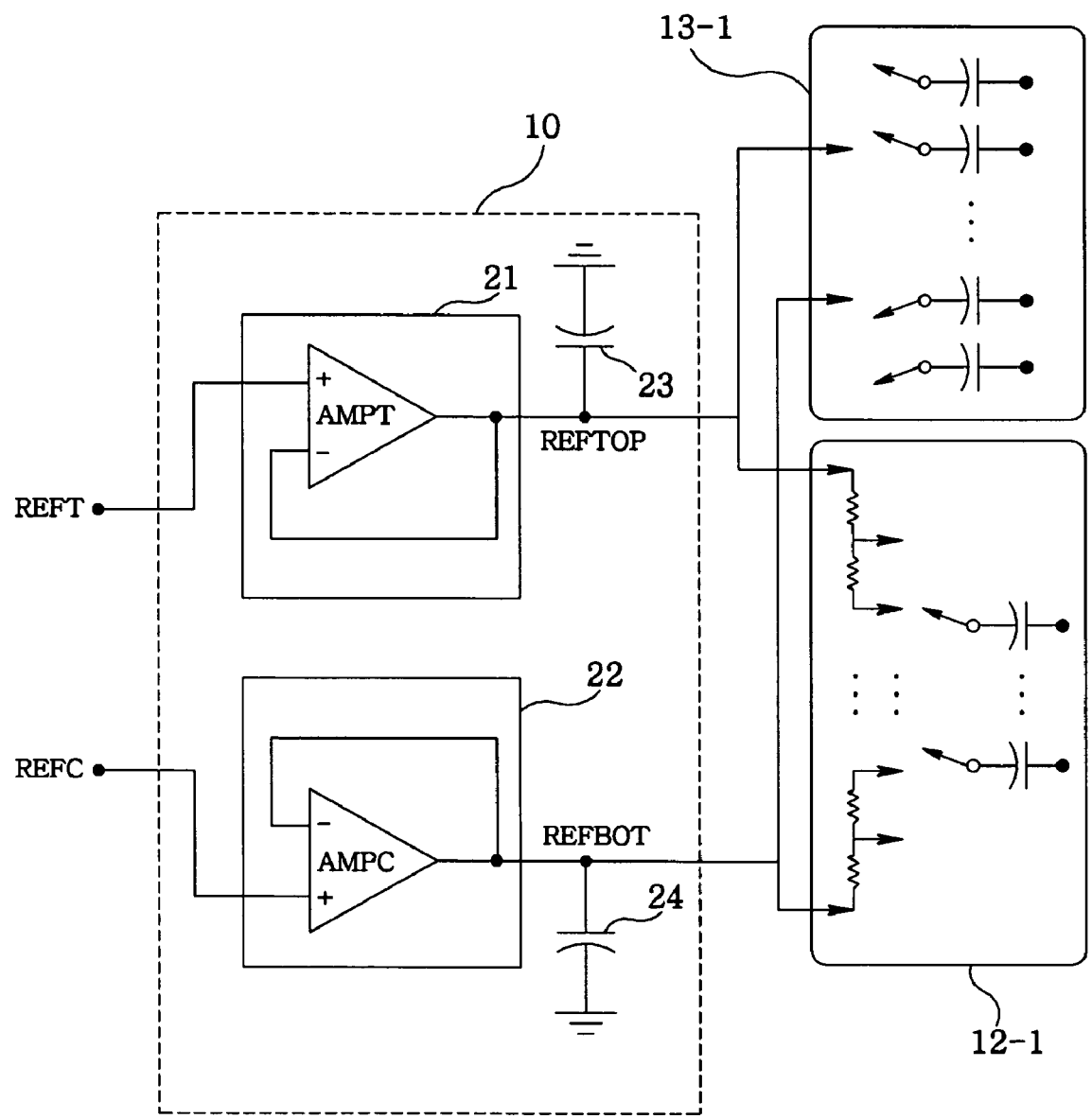
FIG. 2 is a circuit diagram of a reference voltage driving circuit according to the prior art.

The pipelined ADC of FIG. 1 is an exemplary integrated circuit operating at a high speed by being integrated with the reference voltage driving circuit 300 of FIG. 3. Accordingly, the circuit diagram of FIG. 3 is illustrated on the premise that the reference voltage driving circuit 300 is included in and integrated with a pipelined ADC, but it is not limited thereto.

Referring to FIG. 3, the reference voltage driving circuit 300 includes two source followers, one being a first source follower 301, and the other being a second source follower 303.

The first and second source followers 301 and 303 process two reference voltages REFT and REFC, and create output reference voltages RTOP_MDAC and RBOT_MDAC each having a stable value at a high speed and supply them to the MDAC (11-2).

The first source follower 301 receives the reference voltage REFT and outputs the output reference voltage RBOT_MDAC to MDAC (11-2), and the second source follower 303 receives the reference voltage REFC and supplies the output reference voltage RTOP_MDAC to RTOP_MDAC and RBOT_MDAC each having a stable value at a high speed and supply them to the MDAC. The output reference voltages RBOP_MDAC and RTOT_MDAC are respectively reference voltages of MDAC (11-2).

The first source follower 301 includes transistors MPT1 and MPT2.

The transistor MPT2 is operated in such a manner that its source terminal is connected to a power source voltage Vdd, and receives a bias signal PBIAS at its gate terminal. The bias signal PBIAS controls the size of a current $I_d$ flowing in the transistor MPT1.

The transistor MPT1 is such that its source terminal is connected to a drain terminal of the transistor MPT2. A drain terminal of the transistor MPT1 is connected to ground, and a gate terminal of the transistor MPT1 receives the reference voltage REFT.

The second source follower 303 includes transistors MPC1 and MPC2, and includes a construction corresponding to the first source follower 301. The transistor MPC2 is such that a power voltage Vdd is connected to its source terminal, and a bias signal PBIAS is received from its gate terminal.

The transistor MPC1 is such that its source terminal is connected to a drain terminal of the transistor MPC2. A drain terminal of the transistor MPC1 is connected to ground, and a gate terminal of the transistor MPC1 receives the reference voltage REFC.

The transistors MPT1, MPT2, MPC1 and MPC2 are preferably MOSs (Metal-Oxide Semiconductors), and more preferably, are P type MOS devices. Preferably, each bias signal PBIAS relative to the first and second source followers 301 and 303 is the same signal and controls the current $I_d$ flowing in the transistor MPT1 or MPC1, such that values of the output reference voltages RTOP_MDAC and RBOT_MDAC outputted therefrom may be determined.

As depicted in FIG. 3, the first and second source followers 301 and 303 operating in open loop state have a very small output resistance value to thereby enable to hold the output reference voltages RBOP_MDAC and RTOT_MDAC of the reference voltage driving circuit 300 connected to 11-211-2) within a fast time of over several MHz at a constant value. Furthermore, an input terminal of the MDAC may be represented by a combination of capacitors to thereby enable to maintain the output reference voltages RTOP_MDAC and RBOT_MDAC at a constant level.

Meanwhile, 11-211-2 to 11-n) require a relatively higher precision compared with flash ADC 12-1 to 12-n. Consequently, it is preferred that 11-211-2 to 11-n) and flash ADC (12-1 to 12-n) are respectively driven using separate reference voltage driving circuits. The reason is to curb an inroad of noise from flash ADC (12-1 to 12-n) to 11-211-2 to 11-n) requiring a higher precision. Description thereto is illustrated in FIG. 4 by way of embodiment.

Figure 4:
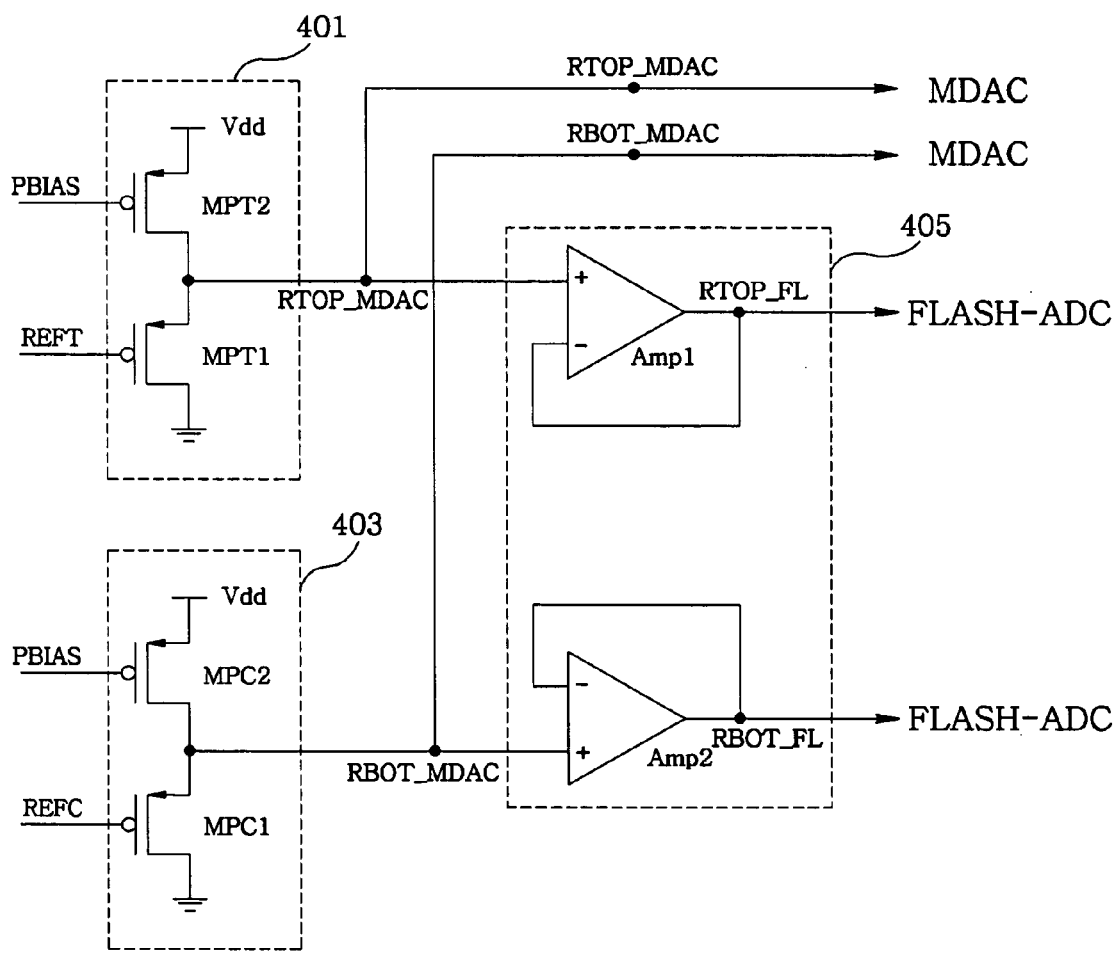
FIG. 4 illustrates a reference voltage driving circuit according to another embodiment of the present invention.

FIG. 4 illustrates a reference voltage driving circuit according to another embodiment of the present invention.

The reference voltage driving circuit 400 differentiate voltages outputted to 11-211-20) and flash ADC (12-1) to enable to block an inroad of noise from flash ADC (12-1) to 11-211-2). The reference voltage driving circuit 400 of FIG. 4 corresponds to the reference voltage driving circuit 300 of FIG. 3.

The output reference voltages RBOT_MDAC and RTOP_MDAC of the first and second source followers 301 and 303 are applied to both ends of the reference voltages of 11-211-2). Adversely, the output reference voltages RBOT_MDAC and RTOP_MDAC of the first and second source followers 301 and 303 are not inputted to the flash ADC (12-1) but inputted to a unity gain amplifier part 405. The unity gain amplifier part 405 includes two amplifiers Amp1 and Amp2 for amplifying the output reference voltages RBOT_MDAC and RTOP_MDAC to each unity gain. Consequently, the output voltage of the unity gain amplifier part 405 is applied to both ends of the reference voltages at flash ADC (12-1).

In other words, the reference voltage driving circuit 400 of FIG. 4 may be represented as independent reference voltage driving circuit separately existing relative to 11-211-2) and flash ADC (12-1). Accordingly, the noise of the flash ADC (12-1) can be prevented from entering 11-211-2) calling for a high precision.

To be more specific, the transistors MPT2 and MPC2 are biased by the same signal PBIAS such that same size of current $I_d$ flows in the transistors MPT1 and MPC1. At this time, if the size (W/L) of the transistors MPT1 and MPC1 is identically constructed, the output reference voltages RTOP_MDAC and RBOT_MDAC can be expressed in the following Equation 1.

$$RTOP\_MDAC = REFT + Vthp + (2*I_d*L/(K*2))^{1/2}$$   Equation 1.

$$RBOT\_MDAC = REFC + Vthp + (2*I_d*L/(K*2))^{1/2}$$

$$(K = Up*Cox)$$

The Equation 1 is based on P type MOS transistor, where Vthp is a threshold voltage, K is a process coefficient, Up is mobility, Cox is a capacitance of gate oxide film, and REFT and REFC denote reference voltages.

Referring to Equation 1, the output reference voltages RTOP_MDAC and RBOT_MDAC may be determined by the size (W/L) of the transistor. A value in which the output reference voltage RBOT_MDAC is subtracted from RTOP_MDAC is the same as a value in which REFC is subtracted from reference voltage REFT. Therefore, predetermined scopes of reference voltages defined by voltages REFT and REFC required by 11-211-2) and flash ADC (12-1) can be formed.

Furthermore, an output reference voltage RTOP_FL of the amplifiers Amp1 and Amp2 fed back by two unity gains inputted from flash ADC (12-1) is the same as RTOP_MDAC, and the output reference voltage RBOT_FL is the same as RBOT_MDAC.

After all, if the output reference voltages RTOP_FL and RBOT_FL of each unity gain amplifier Amp1 and Amp2 are applied to both ends of the reference voltages of flash ADC (12-1), the same reference voltage is applied to 11-211-2) and flash ADC (12-1).

Still furthermore, a closed loop unity gain amplifier part 405, having the output of the first and second source followers 301 and 303 as an input drives the flash ADC (12-1) having a relatively small load compared with that of 11-211-2), can hold the output reference voltages RTOP_FL and RBOT_FL to the flash ADC (12-1) at a constant value within a fast time while reducing the current consumption. Accordingly, the size of the transistors employed for the unity gain amplifiers Amp1 and Amp2 can be reduced to thereby enable to decrease the size of the entire reference voltage driving circuit 400. Particularly, area can be minimized due to the reduced current consumption and size of the transistors.

Figure 5:
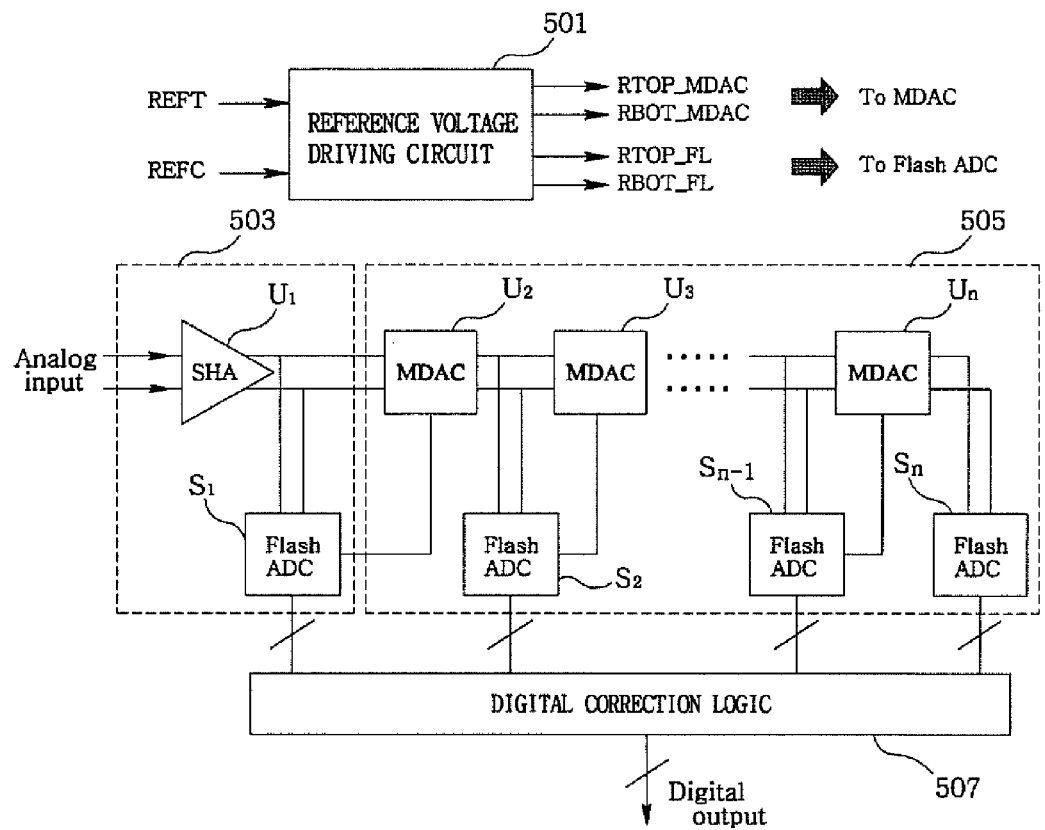
FIG. 5 is a block diagram illustrating a pipelined ADC including a reference voltage driving circuit according to the present invention.

FIG. 5 is a block diagram illustrating a pipelined ADC including a reference voltage driving circuit according to the present invention, where a pipelined ADC 500 of FIG. 5 employs the reference voltage driving circuit 400 of FIG. 4.

Referring to FIG. 5, the pipelined ADC 500 includes a reference voltage driving circuit 501, a first converting part 503, a second converting part 505 and a DCL (Digital Correction Logic. 507). The reference voltage driving circuit 501 corresponds to the reference voltage driving circuit 400 of FIG. 4.

The first converting part 503 comprising a sample/hold amplifier (U1) and a flash ADC (S1) is such that if the sample/hold amplifier (U1) outputs a first analog signal by receiving, sampling and holding a predetermined analog signal, the flash ADC (S1) converts the first analog signal to a first digital signal. The sample/hold amplifier (U1) and the flash ADC (S1) correspond to the sample/hold amplifier 11 and the flash ADC (12-1) of FIG. 1 and may have the same construction as that of the sample/hold amplifier 11 and the flash ADC (12-1) of FIG. 1.

The second converting part 505 includes a plurality (n) of circuit blocks and each circuit block outputs a digital signal ($2^{nd}$ to nth digital signal). At this time, each circuit block includes one of MDACs (U2 to Un) and one of flash ADCs (S2 to Sn). The MDACs (U2 to Un) and the flash ADCs (S2 to Sn) correspondingly operate as MDACs (11-2 to 13-n) and flash ADCs (12-2 to 12-n) of FIG. 1 and may have the same construction as that of MDACs (11-2 to 13-n) and flash ADCs (12-2 to 12-n) of FIG. 1.

The DCL 507 processes the first to nth digital signals outputted from the first and second converting parts 503 and 505 to output a final digital signal, and corresponds to the DCL 14 of FIG. 1.

According to the present invention, a stable reference voltage for integrated circuits operating at a high speed without recourse to integration of external pins or large capacity of capacitors can be supplied. Particularly, an open loop source follower circuit used for a reference voltage driving circuit requires a small number of transistors to thereby enable to reduce the power consumption.

Consequently, an ADC used for the reference voltage driving circuit according to the present invention can be reduced in size thereof, and prices of chip units for the ADC can be reduced to thereby enable to reinforce the price competitiveness.

While specific embodiments have been described, it is evident that many alternatives, modifications, permutations and variations will become apparent to those skilled in the art in light of the foregoing description. Accordingly, reference should be made to the following claims, rather than to the foregoing specification, as indicating the scope of the invention. In this regard, the description above is intended by way of example only and is not intended to limit the present invention in any way, except as set forth in the following claims. Furthermore, to the extent that the term "includes" is used in either the detailed description or in the claims, such term is intended to be inclusive in a manner similar to the term "comprising" as "comprising" is interpreted when employed as a transitional word in a claim.

What is claimed is:

1. A reference voltage driving circuit for a pipelined ADC, the circuit comprising:
    a first source follower for receiving a predetermined first reference voltage (REFT) to output a first output voltage (RTOP_MDAC) corresponding to the first reference voltage to a MDAC (Multiplying Digital to Analog Converter); and
    a second source follower for receiving a second reference voltage (REFC) having a predetermined voltage difference from the first reference voltage, and outputting to the MDAC a second output voltage (RBOT_MDAC) corresponding to the second reference voltage and having the voltage difference,
    wherein the first source follower comprises:
        a first transistor whose source is connected to a predetermined source voltage, and receiving a predetermined bias signal via its gate; and
        a second transistor (MPT1) whose source is connected to a drain of the first transistor and whose drain is connected to ground and receiving the first reference voltage via its gate.

2. The circuit as defined in claim 1, wherein the first source follower comprises:
    a third transistor (MPC2) whose source is connected to a predetermined source voltage and receiving a predetermined bias signal via its gate; and
    a fourth transistor (MPC1) whose source is connected to a drain of the third transistor and whose drain is connected to ground and receiving the second reference voltage via its gate,
    wherein the predetermined bias signals received by the first transistor and the third transistor are identical.

3. The circuit as defined in claim 1, wherein the first and second source followers are embodied by MOSs (Metal-Oxide Semiconductors).

4. The circuit as defined in claim 1, wherein:
    the first source follower comprises a transistor (MPT1) for receiving a predetermined constant current ($I_d$) via its source and whose drain is connected to ground and for receiving the first reference voltage via its gate, and
    the second source follower comprises a transistor (MPC1) for receiving a predetermined constant current ($I_d$) via its source and whose drain is connected to ground and for receiving the second reference voltage via its gate,
    wherein the first and second source followers are identically constructed in sizes (W/L) of transistors thereof, and a difference between the first output voltage and the second output voltage is the same as a difference between the first reference voltage and the second reference voltage.

5. The circuit as defined in claim 1, wherein reference voltage driving circuit further comprises:
    a first amplifier for receiving the first output voltage (RTOP_MDAC) to output to a flash ADC an output signal (RTOP_FL) amplified in unity gain; and
    a second amplifier for receiving the second output voltage (RBOT_MDAC) to output to the flash ADC an output signal (RBOT_FL) amplified in unity gain.

6. The circuit as defined in claim 5, wherein the first source follower, the second source follower, the first amplifier and the second amplifier are packaged into one chip by a semiconductor fabricating process along with the pipelined ADC.

7. A pipelined ADC comprising:
    a first source follower for receiving a predetermined first reference voltage (REFT) to output a first output voltage (RTOP_MDAC) corresponding to the first reference voltage;
    a second source follower for receiving a second reference voltage different from the first reference voltage to output a second output voltage (RBOT_MDAC) corresponding to the second reference voltage;
    an amplifier part for receiving the first output voltage and the second output voltage to output output signals (RTOP_FL) (RBOT_FL) amplified in unity gains;
    a first converting part for converting to a first digital signal a first analog signal sampled and held by receiving a predetermined analog signal;
    a second converting part ($2 \leq i \leq n$) for receiving the signal held by the first converting part and a first digital signal, and outputting i th digital signal for every i th circuit block including a plurality (n) of circuit blocks; and
    a DCL for processing the first to the n th digital signals outputted from the first converting part and the second converting part and outputting a final digital signal,
    wherein the i circuit block of the second converting part comprises:
        an MDAC for converting the i−1 digital signal outputted from an i−1 stage to a reference voltage, based on the first and second output voltages as reference voltages, and for outputting the i th analog signal summed with the i−1 analog signal outputted from the i−1 stage; and
        a flash ADC for converting the i analog signal to the i th digital signal and outputting it, based on the output signals (RTOP_FL) and (RBOT_FL) amplified by the amplifier.

* * * * *